United States Patent
Merritt et al.

(10) Patent No.: US 7,142,443 B2
(45) Date of Patent: *Nov. 28, 2006

(54) REDUCED DATA LINE PRE-FETCH SCHEME

(75) Inventors: Todd A. Merritt, Boise, ID (US); Donald M. Morgan, Meridian, ID (US)

(73) Assignee: Micron Technology Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/207,919

(22) Filed: Aug. 19, 2005

(65) Prior Publication Data

US 2005/0276104 A1   Dec. 15, 2005

Related U.S. Application Data

(60) Continuation of application No. 10/773,074, filed on Feb. 5, 2004, now Pat. No. 6,950,898, which is a division of application No. 09/652,390, filed on Aug. 31, 2000, now Pat. No. 6,704,828.

(51) Int. Cl.
 *G11C 5/06* (2006.01)
(52) U.S. Cl. .................. 365/63; 365/189.05; 365/198; 710/305; 710/300; 712/33

(58) Field of Classification Search ........... 356/185.05; 365/63, 189.05, 198, 207; 710/300, 305; 711/100, 300; 712/33
See application file for complete search history.

(56) References Cited

U.S. PATENT DOCUMENTS

| 4,014,006 A | 3/1977 | Sorensen et al. ........ 340/172.5 |
| 4,947,373 A | 8/1990 | Yamaguchi et al. ... 365/189.04 |
| 5,006,980 A | 4/1991 | Sanders et al. ............. 364/200 |
| 5,325,330 A | 6/1994 | Morgan et al. ........ 365/189.05 |
| 5,463,582 A | 10/1995 | Kobayashi et al. .... 365/189.05 |
| 5,559,969 A | 9/1996 | Jennings et al. ............ 710/307 |
| 6,026,050 A | 2/2000 | Baker et al. ................. 365/233 |
| 6,166,942 A | 12/2000 | Vo et al. ........................ 365/63 |
| 6,704,828 B1 * | 3/2004 | Merritt et al. .............. 710/305 |
| 2002/0021613 A1 * | 2/2002 | Yamauchi .............. 365/230.03 |

* cited by examiner

*Primary Examiner*—Tuan T. Nguyen
*Assistant Examiner*—Toan Le
(74) *Attorney, Agent, or Firm*—Fletcher Yoder PC

(57) ABSTRACT

A memory device for reducing the number of data read lines needed in a memory device. Specifically, multiple helper flip-flops are used to prefetch data in a memory device. The helper flip-flops are configured to latch one or two of the data bits from a 4-bit prefetch in an alternating periodic fashion, thereby necessitating fewer data lines.

19 Claims, 7 Drawing Sheets

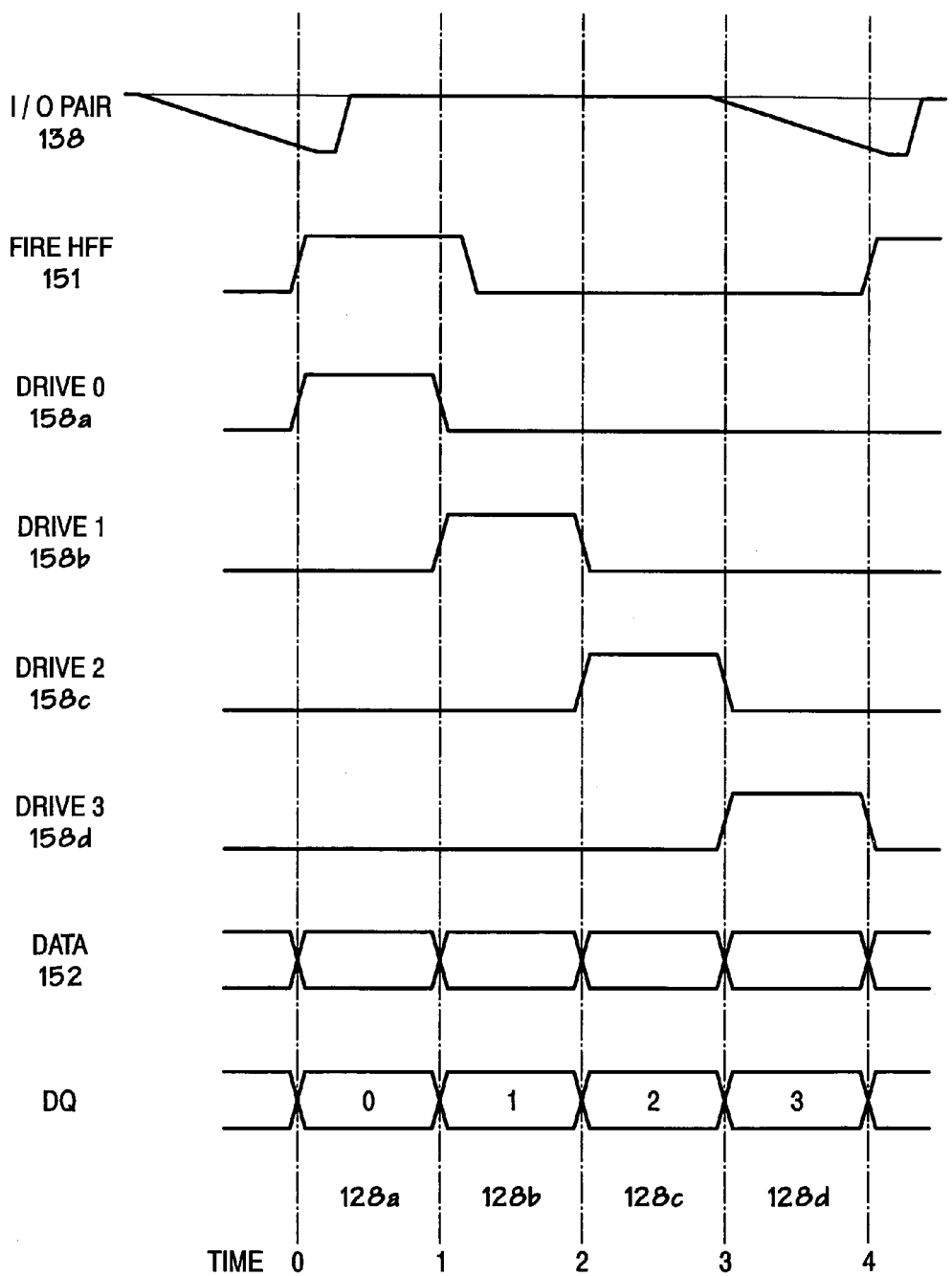

REDUCED DATA LINE PRE-FETCH SCHEME

CROSS-REFERENCE TO RELATED APPLICATIONS

The present application is a continuation of U.S. application Ser. No. 10/73,074, filed on Feb. 5, 2004 now U.S. Pat. No. 6,950,898, which is a divisional application of U.S. application Ser. No. 09/652,390, filed Aug. 31, 2000, now U.S. Pat. No. 6,704,828 which issued on Mar. 9, 2004.

BACKGROUND OF THE INVENTION

1. Field of the Invention

The present invention relates generally to the field of integrated circuit application and, more particularly, to the field of integrated circuit memory devices.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor controlled integrated circuits are used in a wide variety of applications. Such applications include personal computers, vehicle control systems, telephone networks, and a host of consumer products. As is well known, microprocessors are essentially generic devices that perform specific functions under the control of the software program. This program is stored in a memory device which is coupled to the microprocessor. Not only does the microprocessor access memory devices to retrieve the program instructions, but it also stores and retrieves data created during execution of the program in one or more memory devices.

There are a variety of different memory devices available for use in microprocessor-based systems. The type of memory device chosen for a specific function within a microprocessor-based system depends largely upon what features of the memory are best suited to perform the particular function. Memory manufacturers provide an array of innovative fast memory chips for various applications. While both Dynamic Random Access Memories (DRAM) and Static Random Access Memories (SRAM) are making significant gains in speed and bandwidth, even the fastest memory devices can not match the speed requirements of the microprocessors. The solution for providing adequate memory bandwidth depends on system architecture, the application requirements, and the processor, all of which help determine the best memory type for a given application. Limitations on speed include delays in the chip, the package, and the system. Thus, significant research and development has been devoted to finding faster ways to access memory.

Also of concern to researchers has been developing new ways to get more and more capabilities into smaller areas. Engineers have been challenged with finding ways to increase hardware capabilities, with memory capacity being one area in which board geography is at a particular premium. Increasing memory capability while reducing the amount of layout space that the memory components require presents developers with a considerable challenge.

Another type of memory device is a standard Synchronous Dynamic Random Access Memory (SDRAM). Synchronous control means that the DRAM latches information from the processor under the control of a system clock. The processor can be told how many clock cycles it takes for the DRAM to complete its task, so it can safely implement other tasks while the DRAM is processing its request.

One technique for increasing the speed of a synchronous DRAM is called "prefetch." In this case more than one data word is fetched from the memory on each address cycle and transferred to a data selector on an output buffer. Multiple words of data can then be sequentially clocked out for each address access. The main advantage of this approach is that, for any given technology, data can be accessed at multiples of the clock rate of the internal DRAM.

There are also some drawbacks to a prefetch type of architecture. An output register must be added to the chip to hold the multiple words that are prefetched. Disadvantageously, this adds to the chip size. If more than two address bits (two data words) are prefetched, it adds considerably to the chip size but ensures a fast unbroken data stream. An eight-bit prefetch scheme, for example, can achieve a very high frequency of operation for long bursts but it adds a considerable amount of chip area. In addition the power consumption may disadvantageously increase if random addressing is required due to data thrashing.

A two-bit prefetch scheme adds a conventionally acceptable increase in the chip size for narrow I/O width memories. For wide word I/O memories, such as ×32 I/O widths, even a two word prefetch scheme may have an unacceptable die size penalty. With a two-bit prefetch, however, there are limitations on the timing. New column addresses can only occur on alternate cycles since there are always two address bits generated for every access.

The present invention may address one or more of the problems set forth above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, there is provided a memory device comprising a first data bus configured to receive data transmitted to the memory device and a second data bus internal to the memory device and configured to receive the data. The memory array also comprises a memory array for storing the data and a plurality of data amplifiers operatively coupled to the memory array configured to receive the data on a second data bus and transmit data on a third data bus wherein the third data bus is no more than twice as wide as the first data bus.

In accordance with another aspect of the present invention, there is provided a memory device comprising a first data bus configured to receive data transmitted to the memory device and a second data bus internal to the memory device and configured to receive the data. The memory array also comprises a memory array for storing the data and a plurality of data amplifiers operatively coupled to the memory array configured to receive the data on the second data bus and transmit data on a third data bus wherein a frequency of operation of the third data bus is no less than half a frequency of operation of the first data bus.

In accordance with another aspect of the present invention, there is provided a memory device comprising: a memory array and a data amplifier operatively coupled to the memory array and configured to receive data on a 64-bit data bus and configured to transmit data on a 32-bit data bus.

In accordance with yet another aspect of the present invention, there is provided a memory device comprising a memory array and a data amplifier operatively coupled to the memory array and configured to receive data on a 64-bit data bus and configured to transmit data on a 16-bit data bus.

BRIEF DESCRIPTION OF THE DRAWINGS

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The foregoing and other advantages of the invention may become apparent upon reading the following detailed description and upon reference to the drawings representing exemplary embodiments in which:

FIG. 7 illustrates controlled timing diagrams of the embodiment illustrated in FIG. 6.

DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
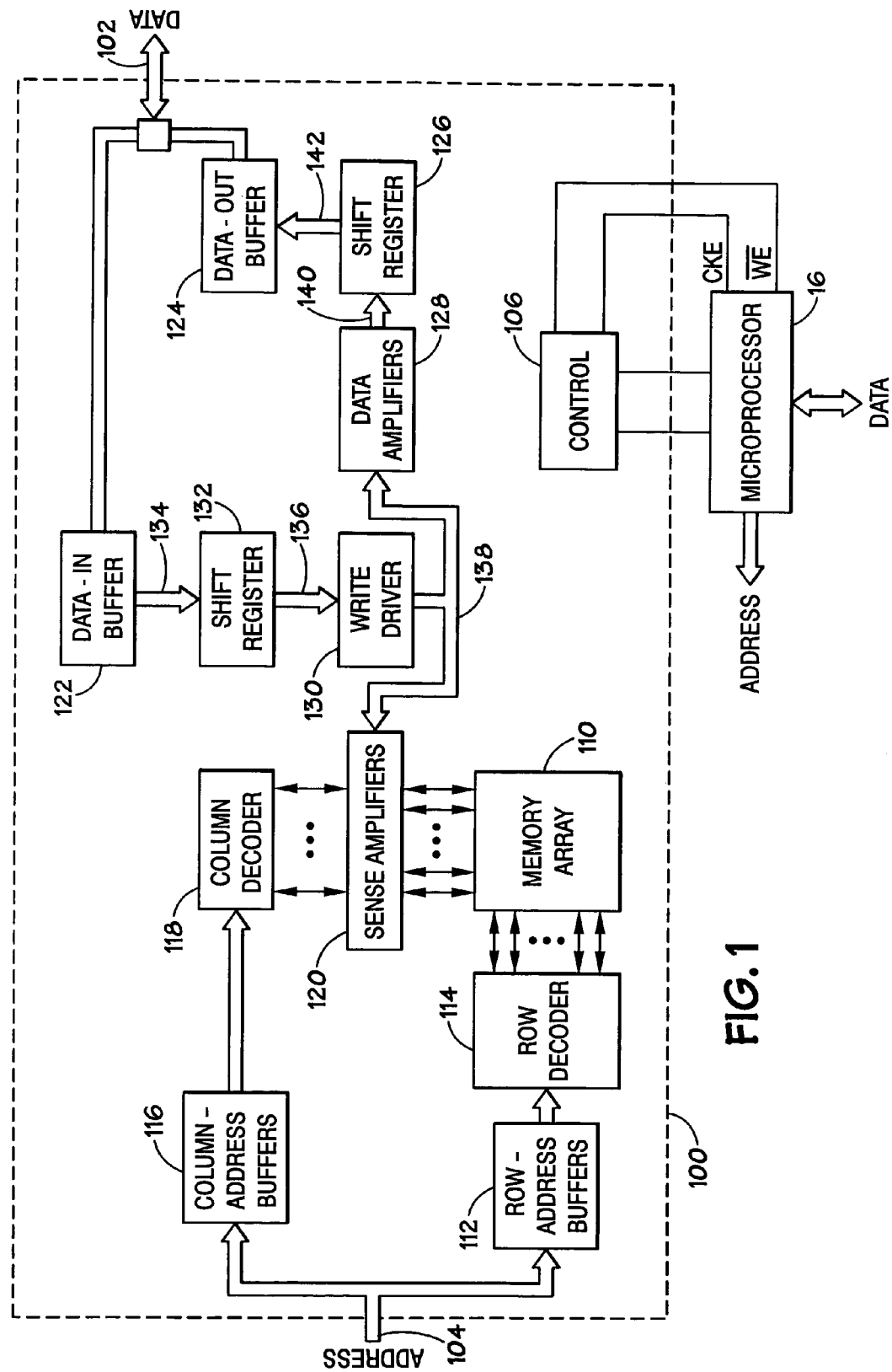
FIG. 1 illustrates a block diagram of an exemplary embodiment of an SDRAM in accordance with the present invention.

Turning now to the drawings, and referring initially to FIG. 1, a block diagram depicting an exemplary embodiment of a SDRAM is illustrated. The description of the SDRAM 100 has been simplified for purposes of illustrating a SDRAM memory device and it not intended to be a complete description of all features of a SDRAM. The present invention is not limited to SDRAMs, and is equally applicable to other synchronous random access memory devices. Those skilled in the art will recognize that a wide variety of memory devices may be used in the implementation of the present invention.

Control, address, and data information provided over a memory bus are represented by individual inputs to the SDRAM 100. These individual representations are illustrated by a databus 102, address lines 104 and various discrete lines directed to control logic 106. As is well known in the art, the SDRAM 100 includes a memory array 110 which comprises rows and columns of addressable memory cells. Each memory cell in a row is coupled to a word line. Additionally, each memory cell in a column is coupled to a bit line. Each cell in the memory array 110 includes a storage capacitor and an access transistor as is conventional in the art. The SDRAM 100 interfaces with, for example, a microprocessor 16 through address lines 104 and data lines 102. Alternatively, the SDRAM 100 may interface with a SDRAM controller, a microcontroller, a chip set or other electronic system. The microprocessor 16 may also provide a number of control signals to the SDRAM 100. Such signals may include row and column address strobe signals RAS and CAS, a write enable signal WE, a clock enable signal CKE and other conventional control signals.

A row address buffer 112 and a row decoder 114 receive and decode row addresses from row address signals provided on the address lines 104. Each unique row address corresponds to a row of cells in the memory array 110. The row decoder 114 includes a word line driver, an address decoder tree, and circuitry which translates a given row address received from row address buffers 112 and selectively activates the appropriate word line of the memory array 110 via the word line drivers.

A column address buffer 116 and a column decoder 118 receive and decode column address signals provided on the address lines 104. The column decoder 118 also determines when a column is defective and the address of a replacement column. The column decoder 118 is coupled to sense amplifiers 120. The sense amplifiers 120 are coupled to complimentary pairs of bit lines of the memory array 110.

The sense amplifiers 120 are coupled to write drivers 130 and data amplifiers 128. The data amplifiers 128 include helper flip flops, as will be discussed later herein. The write drivers 130 are coupled to a shift register 132. The shift register 132 is coupled to a data-in buffer 122. During a write operation, the data bus 102 provides data to the data-in buffer 122. The sense amplifier 120 receives data from the data-in buffer 122 through the shift register 132 and the write driver 130 and stores the data in the memory array 110 as a charge on a capacitor of a cell at an address specified on the address line 104. Typically, the data bus 102 is a 16 bit data bus carrying data at 400 MHz. Each bit is carried on a separate data line. That is to say that the data bus 102 carries data to and from the data-in buffer 122 and the data-out buffer 124 on 16 data lines.

Referring now to the data-in buffer 122, data passes through the data-in buffer 122 and to the shift register 132 on the data bus 134. Typically, the data bus 134 is a 16 bit data bus running at 400 MHz. Shift registers are used to shift the data when transitioning high to low or low to high frequency data buses. Here, where the external data is 16 bits wide and running at 400 MHz along databus 134, the shift register 132 convert the data in order for the write drivers 130 to be able to handle the data without losing any of the information. The shift register 132 is a serial-in-parallel-out shift register which will shift the data which is coming in at a faster frequency and narrow bus (i.e. 400 MHz on a 16 bit bus) to a slower frequency and a wider bus (i.e. 100 MHz/64 bit bus).

The data amplifier 128 is a helper flip-flop (HFF) scheme as will be discussed more specifically with reference to FIG. 2. Prior HFF schemes could only sample 400 MHz data at a 4:1 rate. That is to say that the HFFs could only prefetch at ¼ of the external data rate or 100 MHz. Therefore, to keep up with the amount of data being bused out externally along data bus 142, 64 data lines were needed for the data read bus 142 and the data bus 138 between the sense amp 120 and the data amplifier 128. This slower sampling rate creates a need for increased surface space to accommodate the increase in data lines on the data bus 140 necessary for the data amplifier 128 to process the data without losing any information.

During a read operation, the SDRAM 100 transfers data to the microprocessor 16 from the memory array 110. Complimentary bit lines for the accessed cell are equilibrated during a precharge operation to a reference voltage provided by an equilibration circuit and a reference voltage supply. The charge stored in the accessed cell is then shared with the associated bit lines. The sense amplifier 120 detects and amplifies a difference in voltage between the complimentary bit lines. Address information received on address lines 104 selects a subset of the bit lines and couples them to complimentary pairs of input/output (I/O) wires or lines. When the I/O lines are connected to the bit lines, the influence of the bit lines begins to cause a voltage separation on the complimentary I/O line pairs. After waiting a short time to obtain sufficient separation, a helper flip flop (HFF) is strobed or fired on each I/O pair quickly separating them to full logic levels. The I/O wires pass the amplified voltage signals to the data out buffer 124 through a shift register 126. The data from the data amplifiers 128 is delivered to the shift register 126 along a data read bus 140. The data read bus 140 is typically a 100 MHz, 64 bit bus. The shift register 126 functions as a parallel-in-serial-out device which converts the data back to 400 MHz serial data. The serial data is delivered to the data-out buffer 124 by a serial data bus 142.

The shift register 126 performs the opposite function as shift register 132. The shift register 126 shifts data from a slow frequency and wide data bus to a high frequency and narrow data bus. Specifically, data enters the shift register 126 on the data read bus 140. The data read bus 140 receives data from the data amplifier 128 and is therefore a 64 bit data bus running at 100 MHz. The shift register 126 connects the data to a faster narrower data bus. Thus, data exits the shift register 126 on the data bus 142, which is a 16 bit data bus running at 400 MHz. Data is then passed to the data-out buffer 124.

The control logic 106 is used to control the many available functions of the SDRAM 100. In addition, various control circuits and signals not detailed herein initiate and synchronize the SDRAM 100 operation as known to those skilled in the art. As stated above, the description of the SDRAM 100 has been simplified for purposes of illustrating the present invention and is not intended to be a complete description of all features of a SDRAM. Those skilled in the art will recognize that a wide variety of memory devices including but is not limited to, SDRAMs, SLSDRAMs, RSDRAMs, and other SDRAMs and SRAMs, VRAMs and EEPROMs, may be used in the implementation of the present invention. The SDRAM implementation described herein is illustrative and is not intended to be exclusive or limiting.

In one embodiment of the present technique, a new HFF scheme which allows the internal prefetch to sample at a 2:1 rate, rather than the 4:1 rate is incorporated. In this scheme, the data can be sampled twice as fast since the data can be removed from the data lines faster. Advantageously, the number of data lines can be cut in half thereby saving die size.

Specifically, and referring again to FIG. 1, this embodiment of the present invention will allow the data amplifier 128 to prefetch data at 200 MHz. Therefore, the number of data lines needed for data write bus 136 and data read bus 140 is reduced from 64 to 32.

Figure 2:
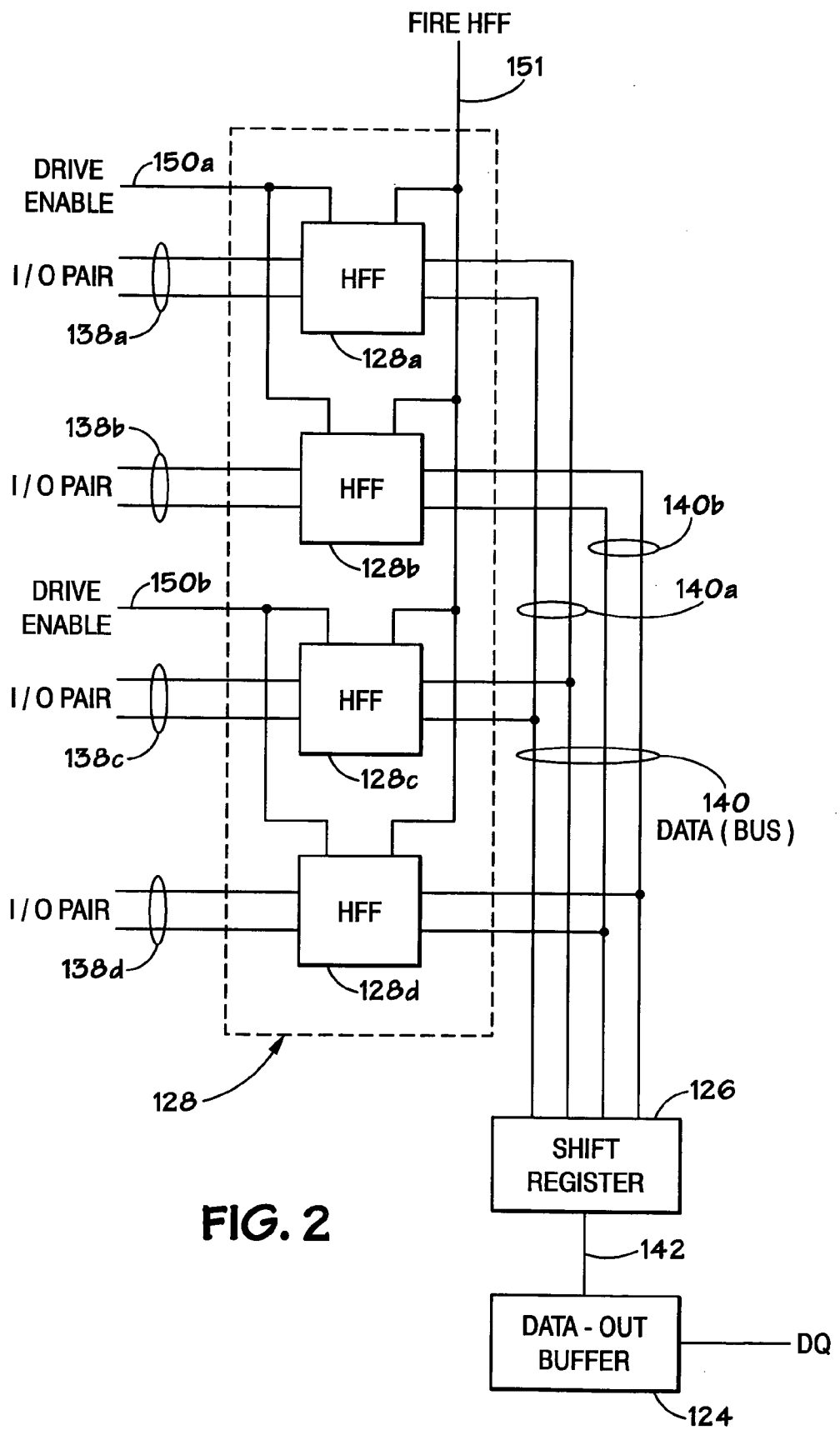
FIG. 2 illustrates a block diagram of one embodiment of the helper flip flops which may be present in a reduced dataline prefetch scheme.

FIG. 2 illustrates an exemplary embodiment of a HFF scheme in accordance with the present invention. A portion of the data amplifier 128 is illustrated. The data amplifier 128 is comprised of a plurality of HFFs. In this illustration, four HFFs are shown (128a–128d). Each HFF 128a–128d receives an I/O pair 138a–138d, each of which represents a single data line or single data bit.

Control 106 may control drive enable lines 150a or 150b which are coupled to HFFs 128a–128d, as illustrated. Drive enable lines 150a and 150b may be timed to send two of the four bits along the data read bus 140 and then send the remaining two bits at some later time. The data read bus 140 illustrates two I/O pairs 140a and 140b. Each I/O pair 140a and 140b represents a single data line or single data bit. Thus, data bus 140 (FIG. 1) can be reduced from a 64 bit data bus running at 100 MHz to a 32 bit data bus, since it is now running at 200 MHz. In this embodiment, the FIRE HFF signal 151 is timed to allow the drive enable lines 150a and 150b to safely latch the data without losing any bits. Likewise, the data write bus 136 (illustrated in FIG. 1) can be reduced from a 64 bit data bus running at 100 MHz to a 32 bit data bus running at 200 MHz.

Figure 3:
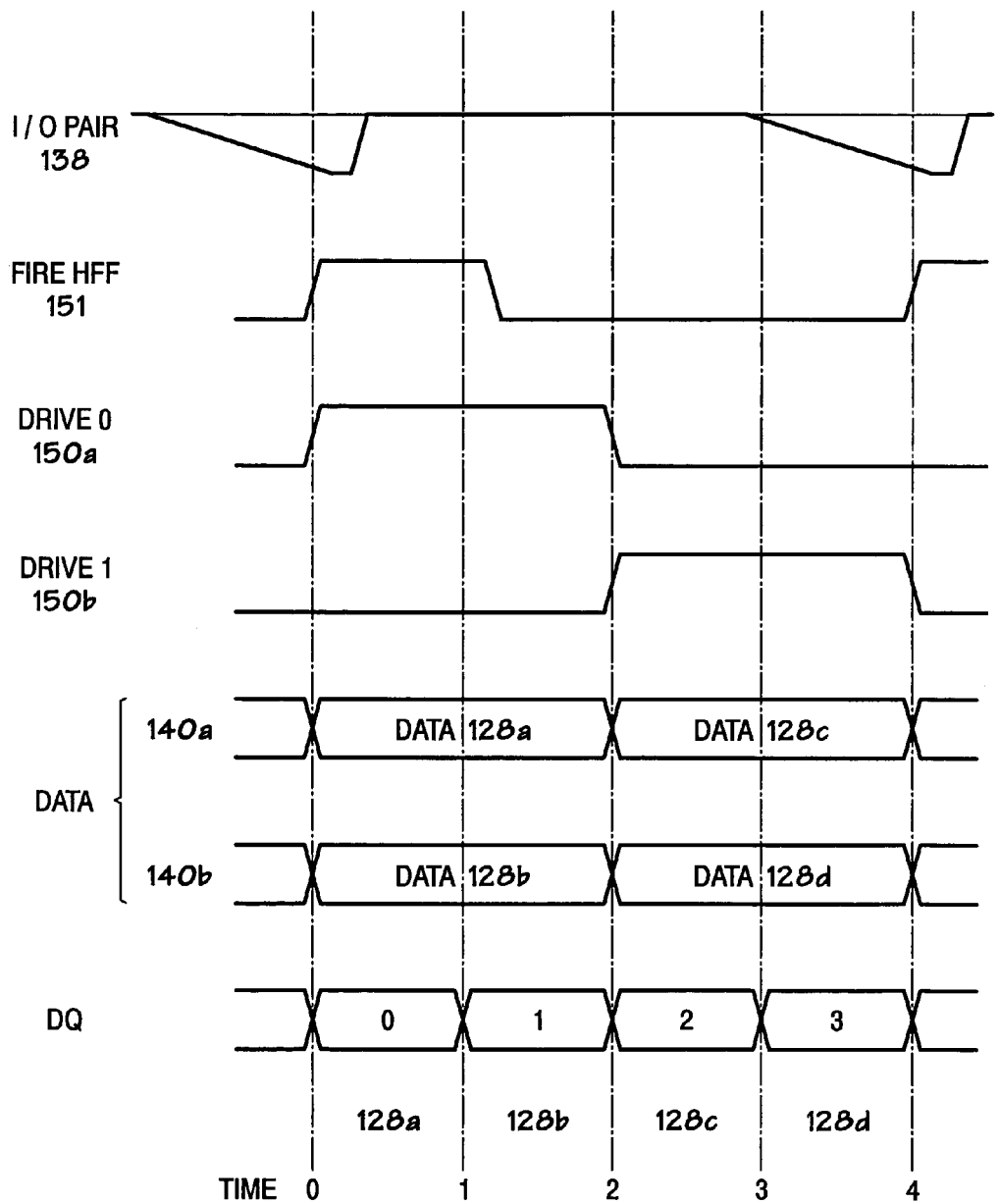
FIG. 3 illustrates controlled timing diagrams in accordance with the embodiment illustrated in FIG. 2.

FIG. 3 illustrates a timing diagram of the embodiment illustrated in FIG. 2. With FIRE HFF turned on for all HFFs 128a–128d, the data in the HFF will drive the I/O as soon as the drive enable signals 150a and 150b are switched on. When drive enable 150a is turned on, HFFs 128a and 128b latch their data onto data lines 140a and 140b. Because the shift register 126 is sending the data along data bus 142 at twice the speed at which data bus 140 is running, the data is not overwritten. As drive enable 150a is turned off and drive enable 150b is turned on, the data from HFFs 128c and 128d is latched onto data lines 140a and 140b. By the time another I/O pair is ready to be latched, Fire HIFF has reset and is ready to begin the process again.

Figure 4:
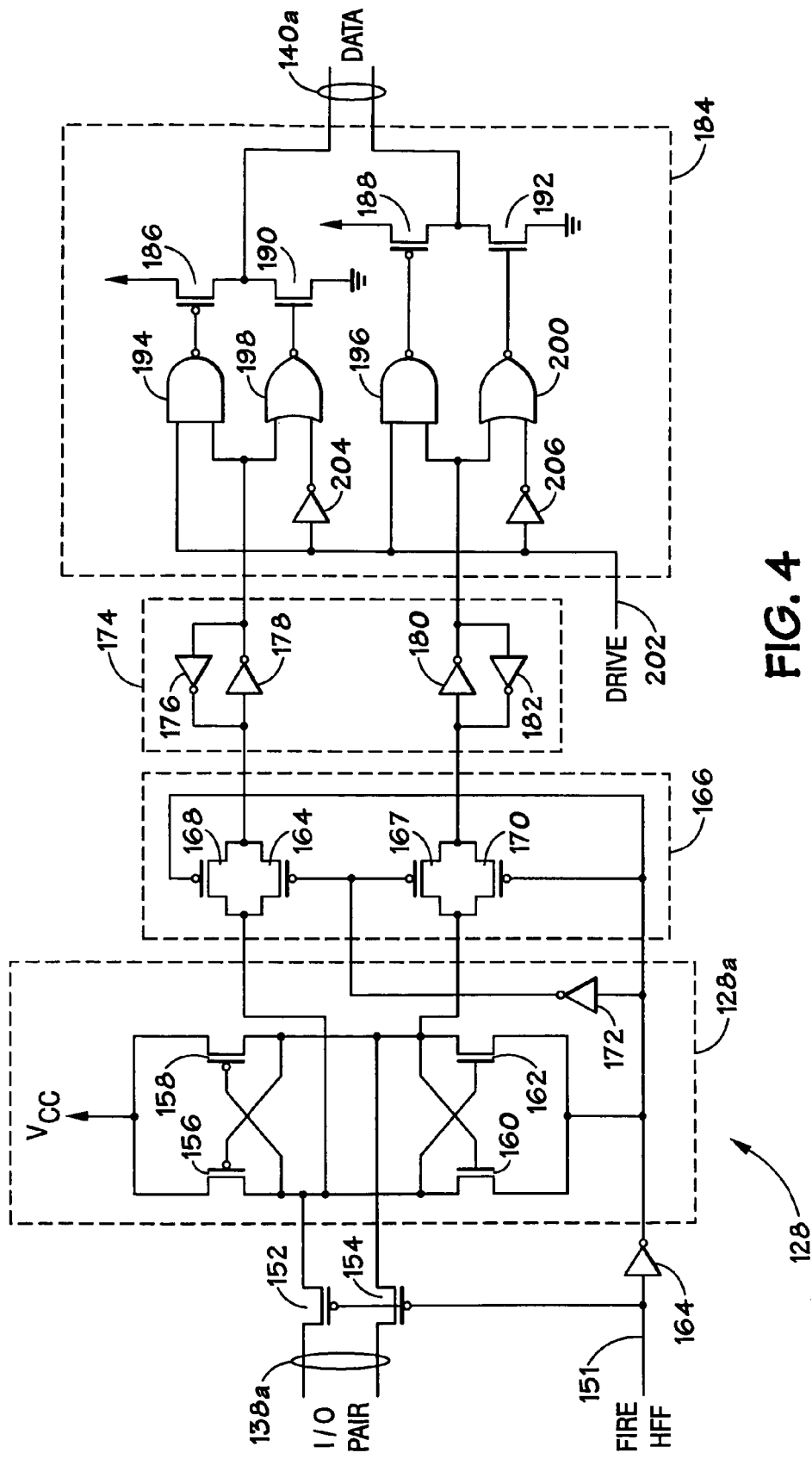
FIG. 4 illustrates a schematic diagram of the embodiment illustrated in FIGS. 2 and 3.

FIG. 4 illustrates a schematic of a portion of a data amplifier 128 design with a precharge circuit incorporated to enable data to a held on the bus, in accordance with the present technique. As should be evident, the functionality of the present technique may be achieved using an almost endless combination of components. The specific elements incorporated in this embodiment may be changed in a variety of manners to achieve the present technique.

Here, I/O pair 138a is delivered to the HFF 128a through p-channel field effect transistors (FETs) 152 and 154. The I/O pair 138a will comprise a high (2.5V) signal and a low signal (2.2V). The signals are isolated by the FETs 152 and 154. The FIRE HFF signal 151 is delivered to the gate of the FETs 152 and 154 to control the latching of the data to the HFF 128a. The internal logic of the HFF 128a is unspectacular. Here, the HFF 128a is illustrated as a set of cross-coupling FETs 156, 158, 160 and 162. FETs 156 and 158 may be p-channel FETs while FETs 160 and 162 may be n-channel FETs. The I/O pairs 138a are coupled to the gates of the FETs 156, 158, 160, and 162. Data delivery will be triggered by the I/O pair 138a signal. The p-channel FETs 156 and 158 may be coupled to a voltage source $V_{cc}$, while the n-channel FETs may be coupled to the FIRE HFF signal 151. The FIRE HFF signal 151 may be delivered to the FETs 160 and 162 through an inverter 164 to insure the proper logic signal.

Unlike prior HFF schemes, the I/O pair 138a is also coupled to an isolated latch 166 to allow the HFF 128a to pre-charge. The isolation latch 166 may include n-channel FETs 164 and 167 and p-channel FETs 168 and 170 which are arranged to allow the HFF 128a to pre-charge after latching the data. The FIRE HFF signal 151 may be delivered to the n-channel FETs 164 and 167 through an inverter 172 to insure the proper logic signal.

Before the HFF is precharged, the data is latched into an inverter loop 174 to be held such that the bits can be delivered according to the alternating sequence discussed with reference to FIGS. 2 and 3. The inverter loop 174 may be comprised of a plurality of inverters 176, 178, 180 and 182 which are configured to hold data until the data is ready to be driven onto the data bus 140 (illustrated in FIG. 1).

Finally, the data is delivered to an output driver 184 which drives the data signals 140a to the shift register 126. The output driver may be comprised of any conventional driver circuit. Here, two tri-state drivers, each comprising a p-channel 186 and 188 and an n-channel 190 and 192 FET are incorporated. Further, the output of NAND gates 194 and 196 are coupled to the gates of the p-channel FETs 186 and 188. The output of NOR gates 198 and 200 are coupled to the gates of the n-channel FETs. The NAND and NOR gates 194, 196, 198, and 200 are driven by DRIVE signal 202 which is delivered to the inputs of each NAND and NOR gate. The DRIVE signal 202 may be delivered to the NOR gates 198 and 200 through inverters 204 and 206 to insure proper logic. The other input to the NAND and NOR gates is coupled to receive the data from the inverter loop 174.

Figure 5:
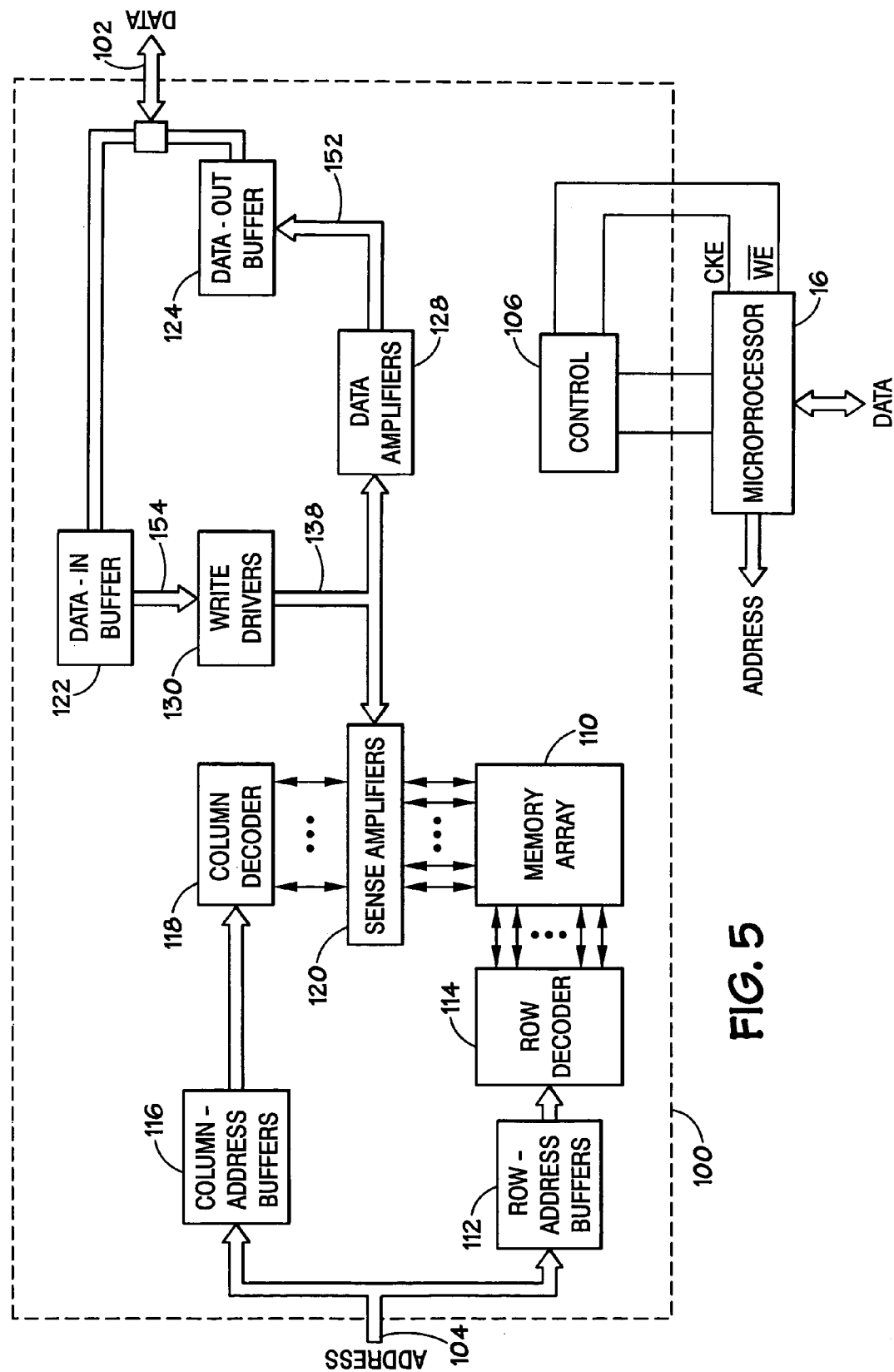
FIG. 5 illustrates an alternate embodiment of an SDRAM.
Figure 6:
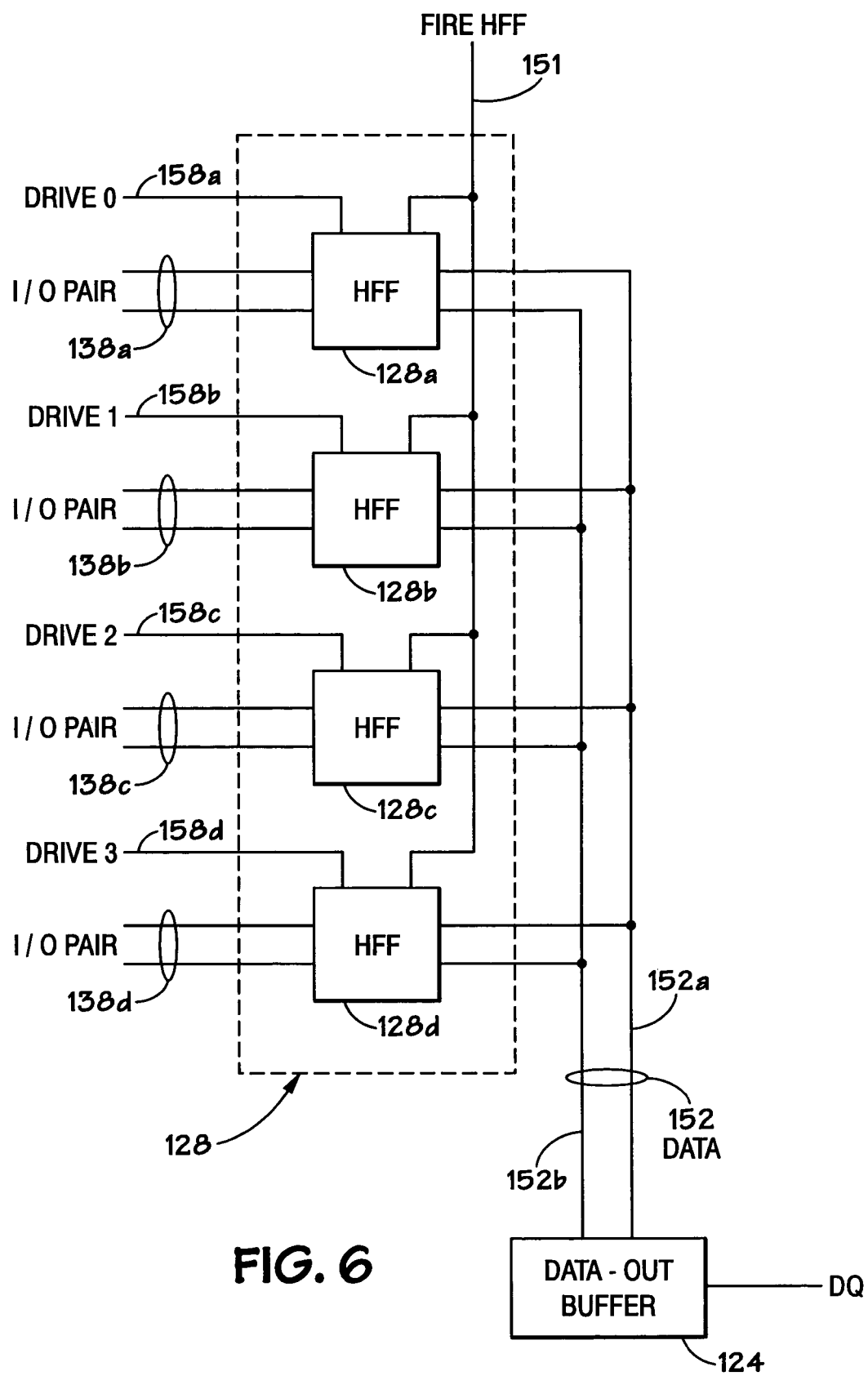
FIG. 6 illustrates a block diagram of an alternate embodiment of the helper flip flops.

An alternate embodiment of the present invention is illustrated in FIGS. 5 and 6. This embodiment allows 1:1 sampling of the data by the data amplifiers 128. FIG. 5 illustrates a block diagram of the alternate embodiment. In this embodiment, the read/write and external data buses are running at the same speed. That is to say that the external data input bus 102, the data read bus 152, and data write bus 154 are all running at 400 MHz. The internal array data bus 138 may still run at 100 MHz. Because there is no change in bus rate from external to internal, no shift registers are used in this embodiment. Thus, aside from the difference in the data rates, the only difference from the embodiment described in FIG. 1 is the absence of the shift registers 128 and 132, and the configuration of the data amplifier 128 (FIG. 1) which is shown as data amplifier 156, and described in greater detail with reference to FIG. 6.

FIG. 6 illustrates a block diagram of the data amplifier 156 for the 1:1 HFF scheme. A portion of data amplifier 156 is illustrated. This embodiment is similar to FIG. 2. Thus, 4 HFFs are shown (156a–156d). Each HFF 156a–156d receives an I/O pair 138a–138d, each of which represent a single data line or single data bit. Here, rather than having two drive enable lines (150a and 150b in FIG. 2), four drive enable lines 158a–158d may be timed to fire the 4 bits in succession to latch the data onto the data bus 152. Here, data bus 152 is a single I/O pair and thus a single data line. Because the data amplifiers 156 are sending data on the data bus 152 at four time the speed at which it is receiving the I/O pairs along the data bus 138, four bits of data can be latched onto a single line or data bus 152, without losing any bits.

FIG. 7 illustrates a timing diagram of the alternate embodiment illustrated by the block diagram in FIG. 6 with Fire HFF turned on for all HFFs 156a–156d, the data will latch as soon as the drive enable signals 158a–158d are switched on. When drive enable 158a is turned on, HFF 156a will latch its data onto data bus 152. Likewise, drive enable 158b will latch the data on HFF 156b, and so forth. Each of the HFFs will have latched its data by the time new data arrives.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory device comprising:
   a first data bus configured to receive data transmitted to the memory device;
   a second data bus internal to the memory device and configured to receive the data;
   a memory array for storing the data; and
   a plurality of data amplifiers operatively coupled to the memory array configured to receive the data on a second data bus and transmit data on a third data bus wherein the third data bus is no more than twice as wide as the first data bus.

2. The memory device, as set forth in claim 1, wherein the third data bus is the same width as the first data bus.

3. The memory device, as set forth in claim 1, wherein the second data bus is twice as wide as the third data bus.

4. The memory device, as set forth in claim 1, wherein the second data bus is four times as wide as the third data bus.

5. The memory device, as set forth in claim 1, wherein the data amplifiers comprise a plurality of helper flip-flops configured to receive four bits of data at a first time, to transmit two bits of the data at a second time, and to transmit two bits of the data at a third time different from the second time.

6. The memory device, as set forth in claim 1, wherein the first data bus comprises a 16-bit data bus.

7. The memory device, as set forth in claim 1, wherein the third data bus comprises a 32-bit data bus.

8. The memory device, as set forth in claim 1, wherein the third data bus comprises a 16-bit data bus.

9. The memory device, as set forth in claim 1, wherein the second data bus comprises a 64-bit data bus.

10. The memory device, as set forth in claim 1, wherein the first data bus comprises a 400 MHz data bus.

11. The memory device, as set forth in claim 1, wherein the third data bus comprises a 200 MHz data bus.

12. The memory device, as set forth in claim 1, wherein the second data bus comprises a 100 MHz data bus.

13. A memory device comprising:
   a first data bus configured to receive data transmitted to the memory device;
   a second data bus internal to the memory device and configured to receive the data;
   a memory array for storing the data; and
   a plurality of data amplifiers operatively coupled to the memory array configured to receive the data on the second data bus and transmit data on a third data bus wherein a frequency of operation of the third data bus is no less than half a frequency of operation of the first data bus.

14. The memory device, as set forth in claim 13, wherein the first data bus operates at the same frequency as the third data bus.

15. The memory device, as set forth in claim 13, wherein the frequency of operation of the third data bus is twice the frequency of the second data bus.

16. The memory device, as set forth in claim 13, wherein the frequency of operation of the third data bus is four times the frequency of the second data bus.

17. A memory device comprising:
   a memory array; and
   a data amplifier operatively coupled to the memory array and configured to receive data on a 64-bit data bus and configured to transmit data on a 32-bit data bus.

18. The memory device, as set forth in claim 17, wherein the data amplifier comprises a plurality of helper flip-flops configured to receive four bits of data at a first time, to transmit two bits of the data at a second time, and to transmit two bits of the data at a third time different from the second time.

19. A memory device comprising:
   a memory array; and
   a data amplifier operatively coupled to the memory array and configured to receive data on a 64-bit data bus and configured to transmit data on a 16-bit data bus.

* * * * *